United States Patent [19]
Hosoya

[11] 4,201,962
[45] May 6, 1980

[54] INPUT TRANSFORMER ARRANGEMENT FOR USE IN A TELEVISION RECEIVER

[75] Inventor: Nobukazu Hosoya, Moriguchi, Japan

[73] Assignee: Sanyo Electric Co., Ltd., Osaka, Japan

[21] Appl. No.: 953,082

[22] Filed: Oct. 20, 1978

[30] Foreign Application Priority Data
Oct. 20, 1977 [JP] Japan ................. 52-126970

[51] Int. Cl.² .......................... H03H 7/38; H03H 7/42
[52] U.S. Cl. ..................................... 333/25; 333/32; 336/184; 343/822
[58] Field of Search .................. 333/24, 25, 32; 343/821, 822, 860, 861; 336/180, 184

[56] References Cited
U.S. PATENT DOCUMENTS 3,223,920  12/1965  Sasaki ........................... 333/25 X
3,631,534  12/1971  Hirota et al. .................. 336/184 X

OTHER PUBLICATIONS

Ruthroff, *Some Broad-Band Transformers*, Proceedings of the IRE, Aug. 1959.

Primary Examiner—Paul L. Gensler
Attorney, Agent, or Firm—Armstrong, Nikaido, Marmelstein & Kubovcik

[57] ABSTRACT

An input transformer arrangement includes an unbalanced signal suppress transformer for suppressing unbalanced signal carried in a feeder line extending between a television receiver and an antenna therefor, and an impedance transformer for dropping the impedance. These two transformers are arranged on one core for unifying and simplifying the arrangement.

8 Claims, 12 Drawing Figures

INPUT TRANSFORMER ARRANGEMENT FOR USE IN A TELEVISION RECEIVER

BACKGROUND OF THE INVENTION

The present invention relates to an input transformer for a television receiver provided between a feeder line extending from an antenna and a tuner and, more particularly, to an arrangement of the input transformer including an unbalanced signal suppress transformer for suppressing unbalanced signal transmitted from the feeder line and an impedance transformer for dropping the impedance.

Generally, the unbalanced signal is produced when one of a pair of lead wires constituting the feeder line carries a reflected signal from a television receiver due to a deformation of a symmetric characteristic of the feeder line. The reflected signal is often caught from a rod type antenna which is located adjacent the television receiver.

Referring to FIG. 1, there is shown a general block diagram of the input transformer connected between an antenna 2 and a tuner 8. A pair of output terminals 2a and 2b of the rod type antenna 2 is connected through a feeder line 3, including a pair of lead wires 3a and 3b, to an unbalanced signal suppress transformer 4. An impedance transformer 6 for dropping the impedance from 300Ω to 75Ω is connected between the unbalanced signal suppress transformer 4 and the tuner 8.

Conventionally, these two transformers 4 and 6 are prepared by two independent and different types of transformers which are, as shown in FIG. 2, a balanced type transformer for the unbalanced signal suppress transformer 4 and an unbalanced type transformer for the impedance transformer 6, each having its own transformer core. As shown in FIG. 2, the unbalanced signal suppress transformer or balanced type transformer 4 includes first and second coils 10 and 12 which are wound on a first half side of a core having a shape similar to a symbol ∞ which is hereinafter referred to as a spectacles frame shaped core and third and fourth coils 14 and 16 which are wound on the second half side of the spectacles frame shaped core. Similarly, the impedance transformer or unbalanced type transformer 6 includes first and second coils 18 and 20 wound on a first half side of another spectacles frame shaped core and third and fourth coils 22 and 24 wound on the second half side of said another spectacles frame shaped core.

However, since these two transformers 4 and 6 are in a close relation to each other in terms of their function in the television receiver, it is preferable to arrange these two transformers 4 and 6 in one unit employing one core for the unbalanced signal suppress transformer 4 and for the impedance transformer 6.

Furthermore, it is preferable to simplify these transformers 4 and 6 by reducing the number of coils employed therein.

SUMMARY OF THE INVENTION

Accordingly, an important object of the present invention is to provide an improved arrangement of an input transformer which serves as the unbalanced signal suppress transformer and, at the same time, as the impedance transformer.

Another important object of the present invention is to provide an improved arrangement of an input transformer of the above described type which is simple in construction and can readily be manufactured at low cost.

In accomplishing these and other objects, there has been provided, in accordance with the present invention, an input transformer arrangement for use in a television receiver comprising a first coil having input and output ends and a second coil having input and output ends. The first and second coils are magnetically coupled to each other in such a manner as to match the phase sequence of the first coil with that of the second coil for forming a first transformer. The input transformer arrangement further comprises a third coil connected between the output end of the first coil and output end of the second coil. The center of the third coil is connected to the ground for forming a second transformer which is a so-called autotransformer. When in use, namely, when the input ends of the first and second coils are connected to a pair of lead wires, respectively, constituting a feeder line extending from an antenna of the television receiver, the first transformer suppresses the unbalanced signal while the second transformer reduces the impedance.

In accordance with a preferred embodiment of the present invention, the first, second and third coils are wound on a core. The core has first and second opening formed in side-by-side relation to each other for forming a first rim portion next to the first opening and remote from the second opening, a second rim portion next to the second opening and remote from the second opening, and a central portion between the first and second openings. In the core described above, the first and second coils are wound on the first rim portion while the third coil is wound on the second rim portion. It is preferable to prepare the width of the central portion not smaller than twice the width of each of the first and second rim portions.

BRIEF DESCRIPTION OF THE DRAWINGS

These and other objects and features of the present invention will become apparent from the following description taken in conjunction with preferred embodiments thereof with reference to the accompanying drawings, in which.

DETAILED DESCRIPTION OF THE INVENTION

Figure 1:
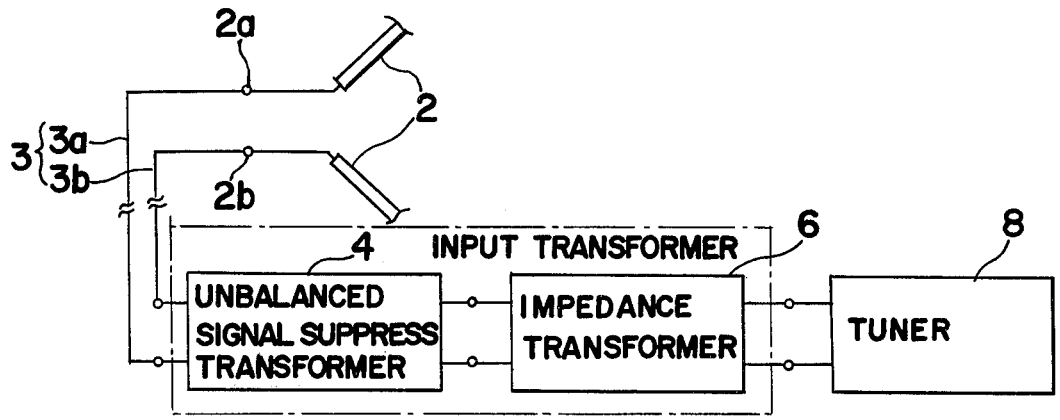
FIGS. 1 and 2 have already been referred to in the foregoing description, FIG. 1 being a block diagram of the input transformer in general and FIG. 2 being a circuit diagram of the input transformer of the conventional type.

Before the description of the present invention proceeds, it is to be noted that like parts are designated by like reference numerals throughout the accompanying drawings.

Figure 3:
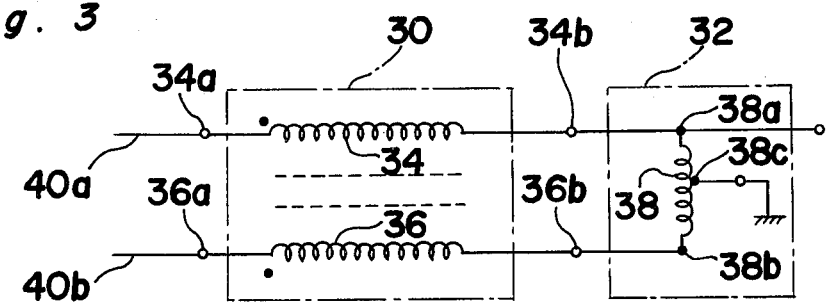
FIG. 3 is a circuit diagram of the input transformer of the present invention.

Referring to FIG. 3, an input transformer of the present invention comprises an unbalanced signal suppress transformer 30 including a first coil 34, having input and output ends 34a and 34b, and a second coil 36 also having input and output ends 36a and 36b. These two coils 34 and 36 are magnetically coupled to each other in such a manner as to match the phase sequence of the first coil with that of the second coil for coinciding the polarity. The coupling coefficient between these two coils 34 and 36 is about 1. The input transformer of the present invention further comprises an impedance transformer 32 including a third coil having opposite ends 38a and 38b connected to the output ends 34b and 36b of the first and second coils, respectively. A center 38c of the third coil 38 is grounded for forming a so-called autotransformer. The input ends 34a and 36a of the first and second coils are connected to lead wires 40a and 40b, respectively, which constitute a feeder line extending from the antenna of the television receiver. The output of the input transformer as described above is obtained from one end, for example, the end 38a of the third coil 38.

Assuming that the wire 40b of the feeder line is carrying an unbalanced signal, such an unbalanced signal is transmitted through the second coil 36 and intermediate tap 38c of the coil 38 to the ground. Since such an unbalanced signal is considerably suppressed or attenuated in the second coil 36, the degree of unbalanced signal induced at the output 38a is so small as to be negligible.

In a similar manner, when the wire 40a of the feeder line is carrying the unbalanced signal, the first coil 34 attenuates the unbalanced signal to a considerably small degree.

In summary, the unbalanced signal carried on either of the wires 40a and 40b of the feeder line can be suppressed by the unbalanced signal suppress transformer 30. On the other hand, since the unbalanced signal suppress transformer 30 has a high coupling coefficient of the coils 34 and 36 with the polarity coinciding with each other, the impedance of the unbalanced signal suppress transformer 30 can be substantially considered zero with respect to the balanced signal. Therefore, no attenuation appears to occur on the balanced signal in the unbalanced signal suppress transformer.

The description is now given to explain that the impedance transformer 32 according to the present invention is substantially equivalent to the impedance transformer according to the prior art described with reference to FIG. 2.

Figure 2:
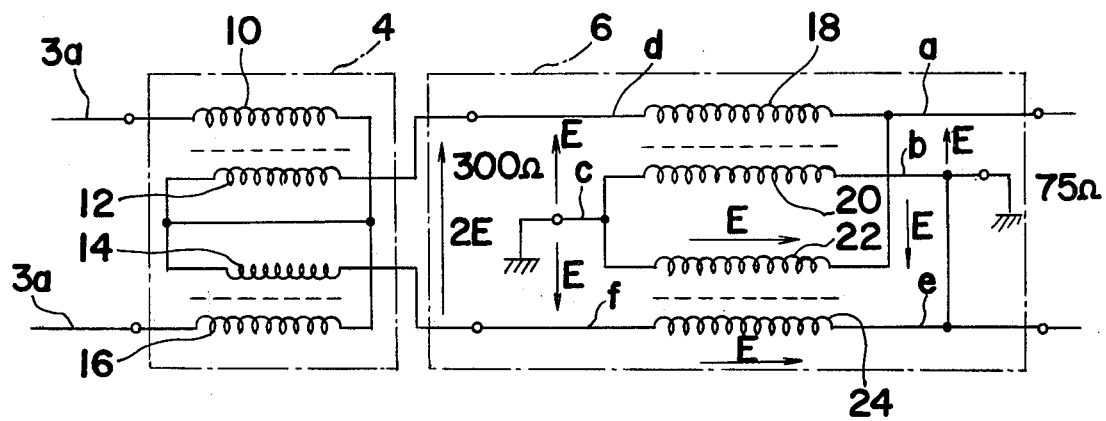
Figure 4:
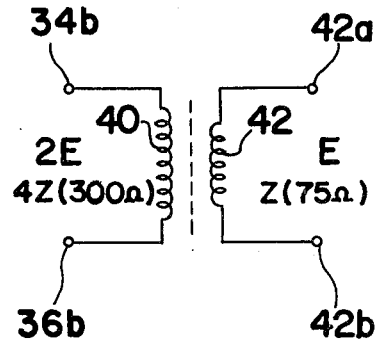
FIG. 4 is a circuit diagram of a transformer which is equivalent to the transformer shown at the right-hand side of FIG. 2.

In FIG. 2, assuming that a voltage E is impressed between points a and b, the voltage produced between points c and d would be the same voltage E, since the potential at the point b is equal to the potential at the point c (ground potential) to produce no voltage across the coil 20 while the potential at the point a is directly transmitted to the point d through the coil 18 which is highly coupled with the coil 20 and can be considered as having zero impedance. At the same time, the application of voltage E between the points a and b also produces voltage E across the coil 22 which is highly coupled with the coil 24. Thus, the same voltage E is also produced across the coil 24. However, since an output side e of the coil 24 is connected to the ground, an input side f of the coil 24 results in voltage $-E$. As a consequence, the voltage appearing between the points d and f would be 2E. The above fact implies that the circuit of impedance transformer 6 shown in FIG. 2 is equivalent to the circuit of a transformer shown in FIG. 4 in which the voltage 2E provided across a primary winding 40 through a pair of terminals 34b and 36b is dropped to half the applied voltage at a pair of terminals 42a and 42b connected to opposite ends of a secondary winding 42, or vice versa. This transformer shown in FIG. 4 is obtained by selecting a ratio of turns of the winding 40 to those of the winding 42 to be 2:1. Thus, the impedance ratio between the windings 40 and 42 is 4:1. Therefore, the impedance of 300Ω appearing between the terminals 40a and 40b is dropped to an impedance of 75Ω at the terminals 42a and 42b.

Figure 5:
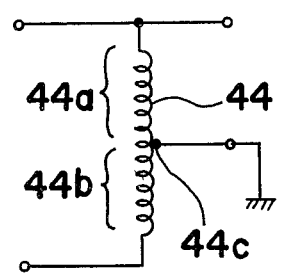
FIG. 5 is a circuit diagram of an autotransformer which is equivalent to the transformer shown in FIG. 4.

The transformer shown in FIG. 4 can be further simplified to an autotransformer, as shown in FIG. 5, in which a center 44c of a winding 44 is grounded while upper and lower winding portions 44a and 44b are preferably wound together in a bifilar winding on a core. The wire used for this coil may preferably be an enamel-coated wire.

As understood from the foregoing description, the arrangement of the input transformer of the present invention as shown in FIG. 3 functions in a similar manner as that of the input transformer of the conventional type shown in FIG. 2. The description is now directed to the design of the input transformer of the present invention.

Figure 6:
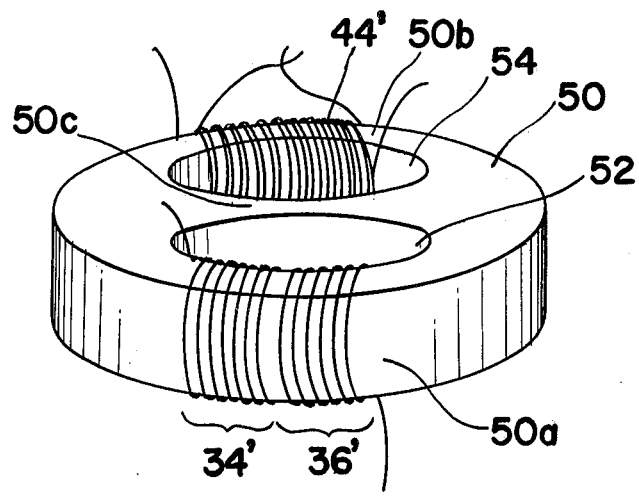
FIG. 6 is a perspective view of the input transformer according to the present invention.

Referring to FIG. 6, the input transformer of the present invention comprises a spectacles frame shaped core 50 having two openings 52 and 54 for forming rim portions 50a and 50b and a central portion 50c between the two openings 52 and 54. Wound on the rim portion 50a are a pair of windings 34' and 36' which correspond to the coils 34 and 36 shown in FIG. 3. It is preferable to wind these two windings 34' and 36' separately but closely adjacent each other. If these windings 34' and 36' were wound as bifilar windings, the distributed capacity between the windings of the coils 34 and 36 becomes so large as to deteriorate the various characteristics of the input transformer such as unbalanced signal suppress ratio and standing-wave ratio which will be described in detail later. On the other hand, wound on the rim portion 50b is a winding 44' which corresponds to the coil 44 shown in FIG. 5. The winding 44' should preferably be wound in the bifilar winding as a manner described above.

Figure 7:
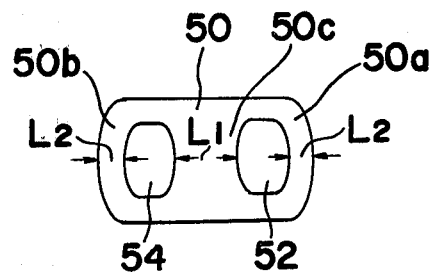
FIG. 7 is a top plan view of a core employed in the input transformer according to the present invention.

It is preferable that, as shown in FIG. 7, the size of the core 50 is such that the thickness $L_1$ of the central portion 50c is not smaller than twice the thickness $L_2$ of either one of the rim portions 50a and 50b so as to prevent either one of the rim portion from being influenced by the magnetic effect taking place in the other rim portion.

Figure 8:
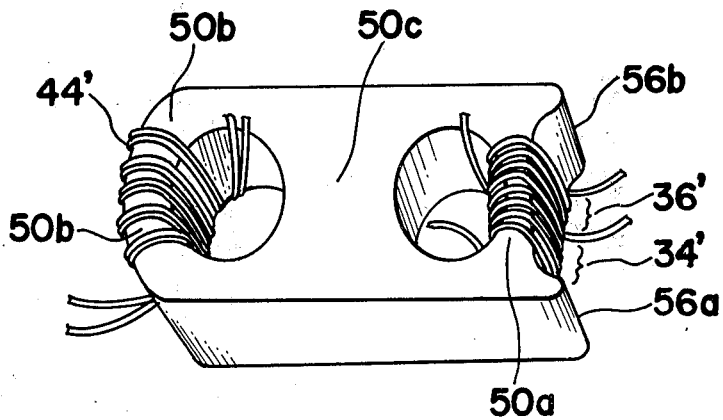
FIG. 8 is a view similar to FIG. 6, but particularly showing a modification thereof.

Referring to FIG. 8, there is shown an input transformer which is a modification of the input transformer described above. In this modification, the rim portion 50a provided with the windings 34' and 36' is thin gauged at the central portion thereof while the opposite end portions thereof are formed with elevated portions 56a and 56b, respectively, for maintaining the separately mounted windings 34' and 36' closely adjacent to each other and for preventing each turn of windings 34' and 36' from being separated apart from neighboring turns as may happen when the rim portion is arcuated as shown in FIGS. 6 and 7.

Figure 9:
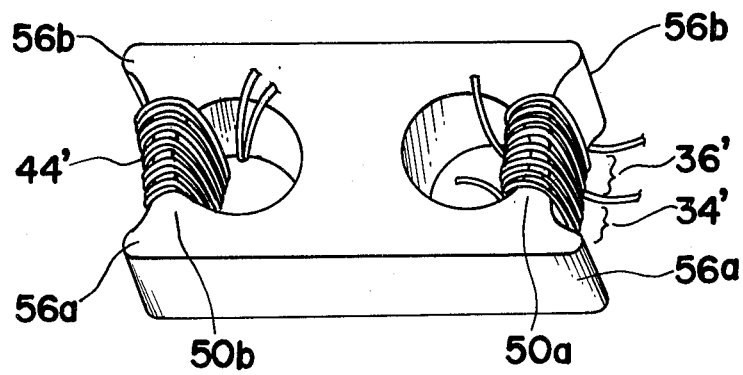
FIG. 9 is a view similar to FIG. 6, but particularly showing another modification thereof.

Referring to FIG. 9, there is shown an input transformer which is another modification of the input transformer described above. In this modification, both rim portions 50a and 50b are thin gauged at the central portion thereof and formed with the elevated portion 56a and 56b as in a similar manner described above for the same purpose described above.

It is to be noted that the rim portion 50b provided with the winding 44' is not as necessary as the rim portion 50a, to have it formed in the thin gauged size, since the winding 44' mounted thereon is a bifilar winding which may be maintained in a gathered condition even when the rim portion 50b is in the arcuated shape.

As it has been fully described by way of examples, the input transformer according to the present invention is much simplified in terms of structure when compared with the input transformer of the conventional type.

Furthermore, since the input transformer of the present invention can be formed in a unit element, it is not only advantageous in assembling the input transformer of the present invention for the television receiver, but also reduces the manufacturing cost.

Moreover, according to the tests carried out by the present inventor, it has been found that the input transformer of the present invention is superior in various characteristics to that of the conventional type. The comparison of the input transformer between the present invention, particularly, the one shown in FIG. 6, and the conventional type is described hereinbelow.

Figure 10:
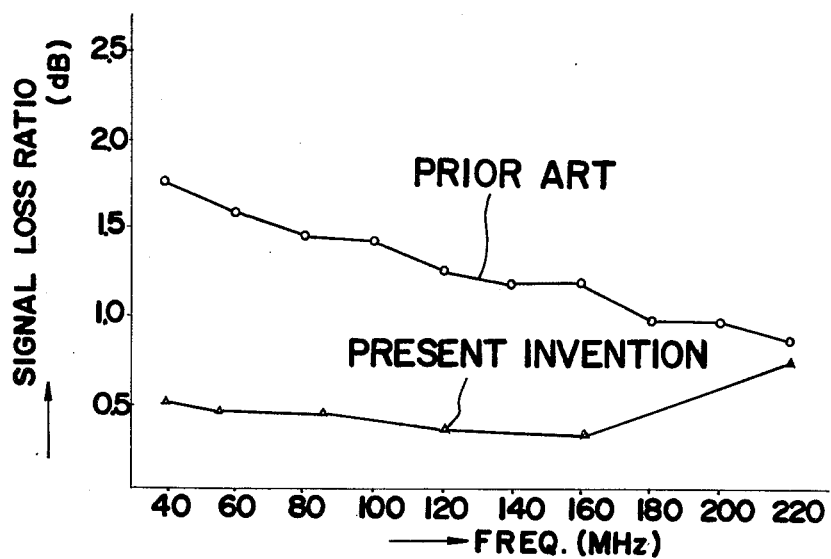
FIGS. 10, 11 and 12 are graphs for evaluating the input transformer of the present invention in comparison with that of the conventional type.

The first test was carried to find signal loss occurring in the input transformer. The degree of signal lost in the transformer was evaluated by taking a ratio between the powers of input and output signals of the input transformer. The result is shown in a graph of FIG. 10 wherein the axes of abscissa and ordinate represent frequency of the signal and signal loss ratio, respectively. As the graph exhibits, a less amount of signal is lost when the input transformer of the present invention is inserted than when the input transformer of the conventional type is inserted.

Figure 11:
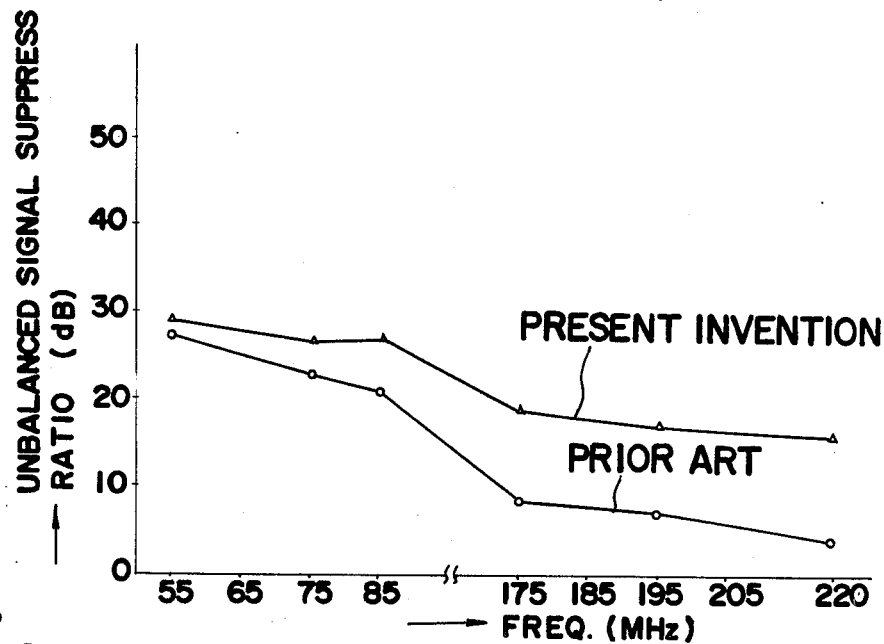

The second test was carried out to find the degree of suppress of the unbalanced signal effected by the input transformer. The degree of suppress of the unbalanced signal was evaluated by taking ratio of power of unbalanced signal input to the input transformer and reduced unbalanced signal output from the input transformer. The result of the test is shown in a graph of FIG. 11 in which the axes of abscissa and ordinate represent frequency of the signal and unbalanced signal suppress ratio, respectively. As the graph exhibits, the input transformer of the present invention reduces or suppresses the unbalanced signal at higher rate than the conventional type.

Figure 12:
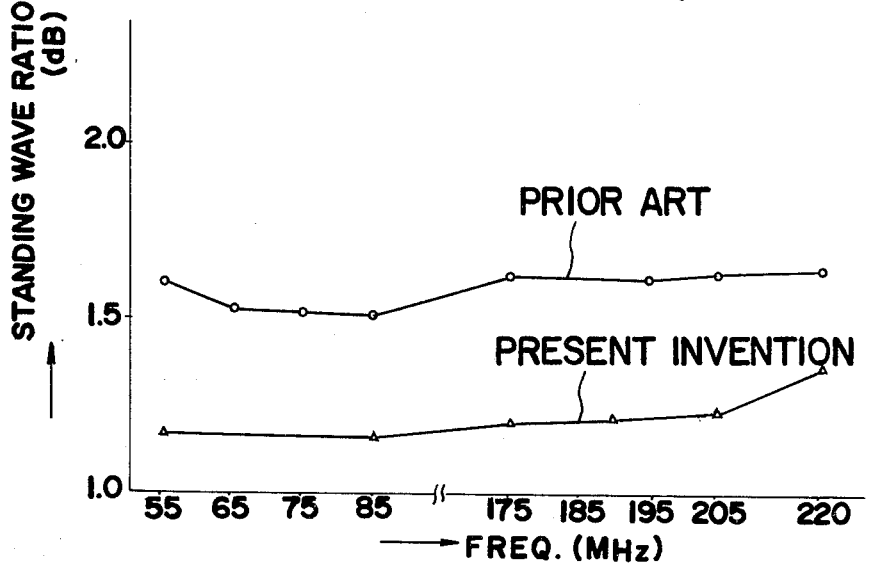

The third test was carried out to find transmission characteristics of the input transformer which was evaluated by taking standing-wave ratio. The result is shown in a graph of FIG. 12 in which the axes of abscissa and ordinate represent frequency of the signal and standing-wave ratio, respectively. It is apparent from the graph of FIG. 12 that the input transformer of the present invention has superior transmission characteristics than that of the conventional type since the input transformer of the present invention shows lower standing-wave ratio than that of the conventional type.

The invention has been described in detail with particular reference to preferred embodiments thereof, but it will be understood that variations and modifications can be effected within the spirit and scope of the invention. Such variations and modifications are to be understood as included within the scope of the invention, unless they depart therefrom.

What we claim is:

1. An input transformer arrangement for use in a television receiver, including an unbalanced signal suppress transformer for suppressing an unbalanced signal carried on at least one of a pair of lead wires constituting a feeder line extending between the television receiver and an antenna therefor, and an impedance transformer, said input transformer comprising:
    a first coil having input and output ends;
    a second coil having input and output ends, said first and second coils magnetically coupled to each other in such a manner as to match the phase sequence of the first coil with that of the second coil for forming a first transformer theretogether; and
    a third coil connected between the output end of the first coil and output end of the second coil, said third coil having a center portion thereof grounded for forming a second transformer,
    the first transformer adapted to suppress the unbalanced signal while the second transformer is adapted to reduce the impedance.

2. An input transformer arrangement as claimed in claim 1, wherein said first transformer has a coupling coefficient thereof substantially equal to 1.

3. An input transformer arrangement as claimed in claim 1 further comprises a core member having first and second openings formed in side-by-side relation to each other for forming a first rim portion next to the first opening and remote from the second opening, a second rim portion next to the second opening and remote from the first opening, and a central portion between the first and second openings, said first and second coils being wound on the first rim portion and said third coil being wound on the second rim portion.

4. An input transformer arrangement as claimed in claim 3, wherein said first and second coils are wound in side-by-side relation to each other.

5. An input transformer arrangement as claimed in claim 3, wherein said third coil is wound as a bifilar winding.

6. An input transformer arrangement as claimed in claim 3, wherein the width of the central portion is not smaller than twice the width of each of the first and second rim portions.

7. An input transformer arrangement as claimed in claim 3, wherein the first rim portion is thin gauged at the central region thereof.

8. An input transformer arrangement as claimed in claim 3, wherein the second rim portion is thin gauged at the central region thereof.

* * * * *